United States Patent
van Empel et al.

(10) Patent No.: US 6,413,701 B1
(45) Date of Patent: Jul. 2, 2002

(54) LITHOGRAPHIC PROJECTION APPARATUS

(75) Inventors: Tjarko A. R. van Empel; Hans Jansen, both of Eindhoven (NL)

(73) Assignee: ASML Netherlands B.V., Veldhoven (NL)

(\*) Notice: Subject to any disclaimer, the term of this patent is extended or adjusted under 35 U.S.C. 154(b) by 47 days.

(21) Appl. No.: 09/590,295

(22) Filed: Jun. 9, 2000

(30) Foreign Application Priority Data

Jun. 11, 1999 (EP) ............................................. 99201861

(51) Int. Cl.$^7$ ................................................. G03C 5/00
(52) U.S. Cl. ........................ 430/320; 430/321; 430/322; 250/492.2; 269/21
(58) Field of Search ................................ 430/320, 321; 250/492.2; 269/21

(56) References Cited

U.S. PATENT DOCUMENTS 5,324,012 A    6/1994   Aoyama et al. .............. 269/21

*Primary Examiner*—Rosemary Ashton
(74) *Attorney, Agent, or Firm*—Pillsbury Winthrop LLP

(57) ABSTRACT

A lithographic projection apparatus includes, a radiation system for supplying a projection beam of radiation, a mask table provided with a mask holder for holding a mask, a substrate table provided with a substrate holder for holding a substrate, a projection system for imaging an irradiated portion of the mask onto a target portion of the substrate, wherein the substrate holder has a supporting face for supporting a substrate and the supporting face is at least partially coated with a layer of electrically conductive material.

7 Claims, 1 Drawing Sheet

LITHOGRAPHIC PROJECTION APPARATUS

BACKGROUND OF THE INVENTION

1. Field of the Invention

The invention relates to a lithographic projection apparatus comprising:
- a radiation system for supplying a projection beam of radiation;
- a mask table provided with a mask holder for holding a mask;
- a substrate table provided with a substrate holder for holding a substrate;
- a projection system for imaging an irradiated portion of the mask onto a target portion of the substrate, the substrate holder having a supporting face for supporting a substrate.

2. Discussion of the Related Art

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of radiation-sensitive material (resist). In general, a single wafer will contain a whole network of adjacent dies which are successively irradiated through the reticle, one at a time. In one type of lithographic projection apparatus, each die is irradiated by exposing the entire reticle pattern onto the die at once; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

Lithographic apparatus may employ various types of projection radiation, such as ultra-violet light (UV), extreme UV, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may loosely referred to in this text, either singly or collectively, as a "lens". The apparatus may comprise components which are operated in vacuum, and are correspondingly vacuum-compatible. As mentioned in the previous paragraph, the apparatus may have more than one substrate table and/or mask table.

In many applications, the supporting face of the substrate holder comprises an underlying surface which is provided with a matrix arrangement of protrusions, each protrusion having an extremity remote from the underlying surface and being embodied such that these extremities all lie within a single substantially flat plane. Further, the substrate holder generally comprises a vacuum wall that protrudes from the underlying surface, encloses the matrix arrangement, and has a substantially uniform height. The underlying surface inside the wall is typically provided with at least one aperture extending through the substrate holder and through which the area enclosed by the wall can be accessed, so as to allow it to be at least partially evacuated. Such evacuation causes a substrate placed on the supporting surface to be sucked against the protrusions, whereby the substrate can be rigidly held in place.

Due to the highly stringent demands placed on the substrate table with regard to its mechanical and thermal stability, the table is generally made of a ceramic or vitreous material. An example of a suitable material in this context is ZERODUR, which is market by SCHOTT and which is predominantly comprised of a mixture of $SiO_2$ and $Al_2O_3$, with the additional presence of various other metal oxides.

It is an object of the invention to provide a lithographic projection apparatus having an improved substrate holder.

This and other objects are achieved in an apparatus as specified in the opening paragraph, characterized in that the said supporting face is at least partially coated with a layer of electrically conductive material.

In experiments leading to the invention, the inventors conducted tests using a vitreous substrate holder and a selection of semiconductor wafers as substrates. In many cases, it was found that the wafers had the annoying habit of sticking to the substrate holder, so that they could not readily be removed after relaxation of the wafer-retaining vacuum.

SUMMARY OF THE INVENTION

Forced removal of such wafers from the substrate holder often resulted in damage to the wafer and/or the finely machined supporting face of the substrate holder, which is unacceptable in most applications.

Further analysis showed that this annoying phenomenon was only occurring for so-called backside-polished wafers, i.e. wafers which are polished to optical surface quality on both major surfaces. Initially, it was thought that the sticking might be due to the phenomenon of "Ansprengen" (also called Van der Waals bonding, or atomic bonding), or to the creation of a static vacuum. However, after much additional investigation, it was speculated that what was actually being observed was an electrostatic effect, whereby the wafer and the supporting face were developing opposite electrical charges, and attracting each other via Coulomb forces. In the case of conventional (i.e. "one-sided") wafers, such Coulomb forces (which decrease rapidly as a function of distance) would be relatively weak, since the natural surface roughness of the wafer's backside would force a relatively significant separation of the wafer and the supporting face. However, in the case of backside-polished wafers, the optical polishing of the wafer's backside allows much more intimate contact between the wafer and the supporting face, and this significantly reduced separation would lead to a greatly increased Coulomb attraction.

To test this idea, the inventors vapor-deposited a thin layer of chromium on the supporting face of the test substrate holder. In subsequent experiments with this Cr-coated substrate holder, the phenomenon of sticking wafers as described above was observed to be completely absent. The inventors thus concluded that the said phenomenon was indeed due to tribo-electrical effects, due for example to minor wafer/holder relative motion during placement of the wafer on the holder. In accordance with the present invention, any charge separation at the interface between the wafer and the supporting surface as a result of such tribo-electrical effects is effectively blocked since the electrically conductive layer keeps the (electrically conductive) wafer backside and the supporting surface at the same electrical potential.

According to the invention, the layer of electrically conductive material deposited on the supporting face of the substrate holder need not be very thick; for example, a layer with a thickness of the order of about 100–300 nm is observed to give good results. Furthermore, the conductive layer does not need to be comprised of Cr; in principle, many different metals can be used, such as Al, Pt and Au, for example, and both elemental metals and alloys may be employed. Use of a conductive polymer instead of a metal is also possible, as is the use of a conductive inorganic compound such as CrN or TiN, for example. In any case, the choice of conductive material will be determined inter alia by the demands of durability and substrate-purity in a particular manufacturing application. The skilled artisan will appreciate that such layers can be provided by many different methods, including such techniques as sputter deposition, MBE and CVD, in the case of metals and inorganic compounds, and spin-coating, spraying and CVD, in the case of conductive polymers. Best results are obtained if the conductive layer covers a substantial area of the supporting face, and ideally a majority of the area or the entire area is thus covered.

In a particular embodiment of the invention, the conductive layer is at least partially overlaid by a dielectric film. This dielectric film should be so thin as to allow significant electrical conduction in a direction perpendicular to the film; e.g. a thickness of the order of about 20–70 nm will generally be satisfactory. Such a dielectric coating can help to improve the durability of the conductive layer underneath, and also combats substrate contamination by the material of the conductive layer. A suitable example of a dielectric material for this purpose is $SiO_x$ (silica, including quartz), though other materials may also be employed in particular applications, such as $Al_2O_3$ or SiN, for example.

The invention also relates to a device manufacturing method comprising the steps of:
providing a substrate which is at least partially covered by a layer of radiation-sensitive material;
providing a mask which contains a pattern;
using a projection beam of radiation to project an image of at least part of the mask pattern onto a target area of the layer of radiation-sensitive material.
According to the invention, such a method is characterized in that during the projection step, the substrate is supported on a supporting face of a substrate holder, said supporting face being at least partially coated with a layer of electrically conductive material.

In a manufacturing process using a lithographic projection apparatus according to the invention, a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of an exemplary Embodiment and the accompanying schematic drawings, whereby.

DETAILED DESCRIPTION OF THE INVENTION

Figure 1:
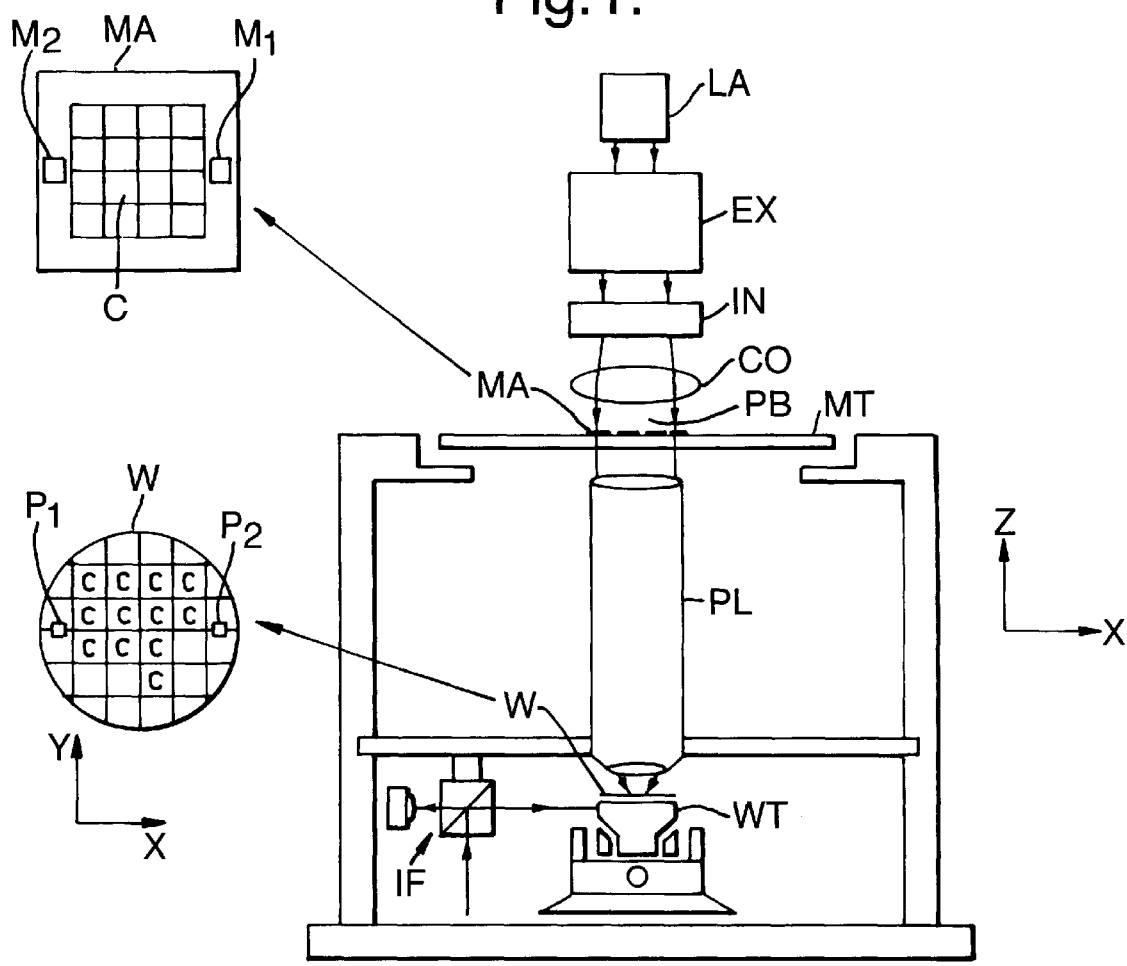
FIG. 1 schematically depicts a lithographic projection apparatus suitable for implementation of the current invention, FIG. 2 renders a cross-sectional view of part of a substrate holder as specified by the invention.

FIG. 1 schematically depicts a lithographic projection apparatus suitable for implementation of the current invention. The apparatus comprises:
a radiation system LA, Ex, IN, CO for supplying a projection beam PB of radiation;
a mask table MT provided with a mask holder for holding a mask MA (e.g. a reticle);
a substrate table WT provided with a substrate holder for holding a substrate W (e.g. a resist-coated silicon wafer);
a projection system PL for imaging an irradiated portion of the mask MA onto a target portion C (die) of the substrate W.
In this case, the depicted apparatus comprises refractive components. However, it may alternatively comprise one or more reflective components.

The radiation system comprises a source LA (e.g. a Hg lamp or excimer laser, a thermionic gun or ion source, or a secondary source from a wiggler/undulator situated around the path of an electron beam in a storage ring or synchrotron) which produces a beam of radiation. This beam is passed along various optical components—e.g. beam shaping optics Ex, an integrator IN and a condenser CO—so that the resultant beam PB has a desired shape and intensity distribution in its cross-section.

The beam PB subsequently intercepts the mask MA which is held in a mask holder on a mask table MT. Having traversed the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB. Similarly, the mask table MT can be positioned very accurately with respect to the beam PB. In general, movement of the mask table MT and the substrate table WT will be realized with the aid of a long stroke module (course positioning) and a short stroke module (fine positioning), which are not explicitly depicted in FIG. 1. In the case of a waferstepper, as opposed to a step-and-scan device, the mask table MT may only be moved with a short stroke module, or may be just fixed.

The depicted apparatus can be used in two different modes:

In step mode, the mask table MT is fixed, and an entire mask image is projected in one go (i. e. a single "flash") onto a target area C. The substrate table WT is then shifted in the x and/or y directions so that a different target area C can be irradiated by the (stationary) beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

Figure 2:
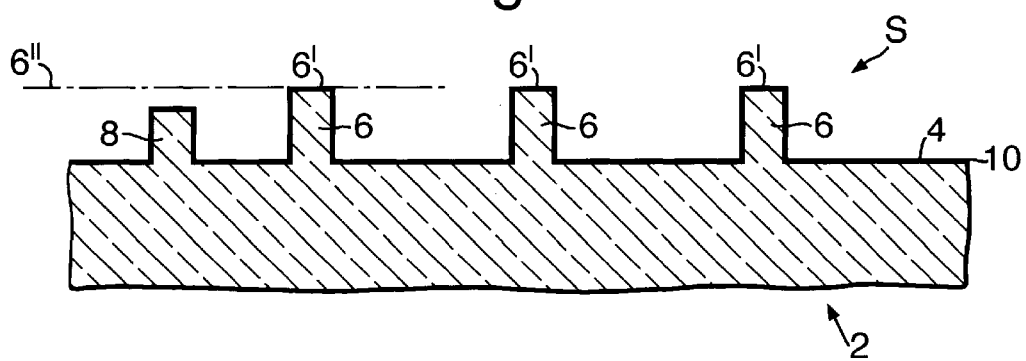

The substrate table WH has a substrate holder that is not explicitly depicted in FIG. 1, but is shown in partial cross-section in FIG. 2. The substrate holder 2 comprises an underlying surface 4 which is provided with a matrix arrangement of protrusions 6, each protrusion having an extremity 6' remote from the underlying surface 4 and being embodied such that these extremities all lie within a single substantially flat plane 6"; this will be the plane of a wafer placed upon the holder 2. Further, the substrate holder 2 generally comprises a vacuum wall 8 that protrudes from the underlying surface 4, encloses the matrix arrangement, and has a substantially uniform height. The structure 4,6,6',8 comprises the supporting face S referred to in claim 1.

In this particular embodiment, the bulk of the holder 2 is comprised of (non-conductive) vitreous material. In accordance with the invention, the supporting face S has been coated with a thin layer 10 of conductive material, such as Cr. If desired, this conductive layer 10 may be overlaid by a very thin dielectric film (not depicted), e.g. comprised of $SiO_x$. The layer 10 has a thickness of approximately 200 nm.

The presence of the conductive layer 10 prevents electrical charging of the substrate holder 2 via tribo-electric effects; in turn, this inhibits the phenomenon of sticking wafers as described above.

What is claimed is:

1. A lithographic projection apparatus comprising:

a radiation system constructed and arranged to supple a projection beam of radiation;

a mask table provided with a mask holder for holding a mask;

a substrate table provided with a substrate holder for holding a substrate and the substrate holder having a supporting face for supporting a substrate, said supporting face being at least partially coated with a layer of electrically conductive material;

a projection system constructed and arranged to image an irradiated portion of the mask onto a target area of the substrate.

2. An apparatus according to claim 1, wherein the conductive material comprises metal.

3. An apparatus according to claim 1, wherein the layer of electrically conductive material is at least partially overlaid by a dielectric film.

4. An apparatus according to claim 3, wherein the dielectric film comprises silica, $SiO_x$.

5. An apparatus according to claim 1, wherein the substrate holder comprises material selected from the group formed by vitreous materials and ceramic materials.

6. A device manufacturing method comprising:

providing a substrate onto a substrate holder, said substrate being at least partially covered by a layer of radiation-sensitive material;

using a projection beam of radiation to project an image of at least part of a mask pattern onto a target area of the layer of radiation-sensitive material; and maintaining a supporting surface of said substrate holder and an adjacent surface of said substrate at a substantially same electrical potential by the presence of a layer comprising a conductive material between said supporting surface and said adjacent surface so as to inhibit opposite electrical charge attraction therebetween.

7. A device manufactured using a method as claimed in claim 6.

\* \* \* \* \*